United States Patent [19]

Tamagawa et al.

[11] Patent Number: 4,939,063

[45] Date of Patent: * Jul. 3, 1990

[54] LIGHT-SENSITIVE MATERIAL COMPRISING LIGHT-SENSITIVE LAYER PROVIDED ON SUPPORT COMPRISING A COATING LAYER CONTAINING A RESIN

[75] Inventors: Shigehisa Tamagawa, Shizuoka; Masayuki Kuroishi, Kanagawa, both of Japan

[73] Assignee: Fuji Photo Film Co., Ltd., Kanagawa, Japan

[*] Notice: The portion of the term of this patent subsequent to Oct. 3, 2006 has been disclaimed.

[21] Appl. No.: 207,973

[22] Filed: Jun. 17, 1988

[30] Foreign Application Priority Data

Jun. 17, 1987 [JP] Japan .................. 62-150974

[51] Int. Cl.$^5$ .................. G03C 1/87; G03C 1/68
[52] U.S. Cl. .................. 430/138; 430/281; 430/531; 430/536; 430/538; 427/145; 427/146; 427/147
[58] Field of Search .............. 430/138, 538, 281, 531, 430/536; 427/145, 146, 147

[56] References Cited

U.S. PATENT DOCUMENTS

| | | |
|---|---|---|
| 4,425,405 | 1/1984 | Marakami et al. .......... 428/342 |
| 4,482,628 | 11/1984 | Katsura et al. .......... 430/538 |
| 4,503,118 | 3/1985 | Marakami et al. .......... 428/323 |
| 4,558,002 | 12/1985 | Aotsuka et al. .......... 430/538 |
| 4,562,145 | 12/1985 | Woodward et al. .......... 430/538 |
| 4,572,893 | 2/1986 | Asao .......... 430/538 |
| 4,614,688 | 9/1986 | Tamagawa et al. .......... 428/331 |
| 4,629,676 | 12/1986 | Hayakawa et al. .......... 430/203 |
| 4,801,509 | 1/1989 | Uno et al. .......... 428/513 |

FOREIGN PATENT DOCUMENTS 203613 12/1986 European Pat. Off. .

*Primary Examiner*—Paul R. Michl
*Assistant Examiner*—Patrick A. Doody
*Attorney, Agent, or Firm*—Sughrue, Mion, Zinn, Macpeak & Seas

[57] ABSTRACT

A light-sensitive material comprising a light-sensitive layer containing silver halide, a reducing agent and an ethylenic unsaturated polymerizable compound provided on a paper support. The paper support comprises a coating layer containing a hydrocarbon resin provided on a base paper sheet, and the paper support has a low water absorptiveness of not more than 1 g/m$^2$ on the surface of the coating layer on which the light-sensitive layer is provided. The water absorptiveness being a value measured according to the Cobb test method.

17 Claims, No Drawings

4,939,063

LIGHT-SENSITIVE MATERIAL COMPRISING LIGHT-SENSITIVE LAYER PROVIDED ON SUPPORT COMPRISING A COATING LAYER CONTAINING A RESIN

FIELD OF THE INVENTION

This invention relates to a light-sensitive material comprising a light-sensitive layer containing silver halide, a reducing agent and a polymerizable compound provided on a support.

BACKGROUND OF THE INVENTION

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publications No. 45(1970)-11149 (corresponding to U.S. Pat. No. 3,697,275), No. 47(1972)-20741 (corresponding to U.S. Pat. No. 3,687,667) and No. 49(1974)-10697, and Japanese Patent Provisional Publications No. 57(1982)-138632, No. 57(1982)-142638, No. 57(1982)-176033, No. 57(1982)-211146 (corresponding to U.S. Pat. No. 4,557,997), No. 58(1983)-107529 (corresponding to U.S. Pat. No. 4,660,637), No. 58(1983)-121031 (corresponding to U.S. Pat. No. 4,547,450) and No. 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore the process takes a relatively long time for the operation.

An improved image forming method employing a dry process is described in Japanese Patent Provisional Publications No. 61(1986)-69062 and No. 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to light so as to form a latent image, and then the material is heated to form a polymer within the area where the latent image of the silver halide has been formed. The above method employing the dry process and the light-sensitive material employable for such method are also described in Japanese Patent Provisional Publications Nos. 61(1986)-183640, No. 61(1986)-188535, No. 61(1986)-228441 and No. 61(1986)-278849.

The above-mentioned image forming methods are based on the principle in which the polymerizable compound is polymerized within the area where a latent image of the silver halide has been formed.

Japanese Patent Provisional Publication No. 61(1986)-260241 describe another image forming method in which the polymerizable compound within the area where a latent image of the silver halide has not been formed is polymerized. In this method, when the material is heated, the reducing agent functions as polymerization inhibitor within the area where a latent image of the silver halide has been formed, and the polymerizable compound within the other area is polymerized.

Japanese Patent Provisional Publication No. 61(1986)-73145 (corresponding to U.S. Pat. No. 4,629,676 and European Patent Provisional Publication No. 0174634A2) describes an embodiment of the image forming method, which comprises: imagewise exposing a light-sensitive material comprising a light-sensitive layer containing silver halide, a reducing agent and a polymerizable compound provided on a support to form a latent image of silver halide; simultaneously or thereafter developing the light-sensitive material; and pressing the light-sensitive material on an image-receiving material to transfer the unpolymerized polymerizable compound to the image-receiving material.

As the support for the light-sensitive material, a paper is sometimes employed, because a paper is disposable, lightweight and easy to handle.

SUMMARY OF THE INVENTION

According to study of the present inventors, a paper support sometimes shows certain unfavorable behavior in the above-stated image forming method. In more detail, in the case that the unpolymerized polymerizable compound is transferred from the light-sensitive material employing a paper support to the image-receiving material, low optical density spots containing only an extremely small amount of the polymerizable compound are sometimes formed on the image-receiving material within the area where a sufficient amount of the polymerizable compound should be transferred.

The present inventors have studied on the above-mentioned behavior of a paper support and discovered that at least one cause of the production of the low optical density spots is attributed to uneven penetration of certain components of the light-sensitive layer into a matrix of the paper support. The occurrence of low density spots has been reduced by using a paper support having a low water absorptiveness of not more than 3 $g/m^2$, which is a value measured according to Cobb test method. A light-sensitive material which employs the paper support having the low water absorptiveness is described in U.S. patent application Ser. No. 081,390 filed on Aug. 4, 1987 in the name of the present inventors.

Recently, the present inventors have further noted that the sensitivity of a light-sensitive material employing the paper support is relatively low, as compared with that using other material as the support such as polyethylene terephthalate film. Furthermore, it is observed that the sharpness of the obtained image is also relatively low when the paper support is employed.

An object of the present invention is to provide a light-sensitive material employing a paper support which has a high sensitivity.

Another object of the invention is to provide a light-sensitive material employing a paper support which is further minimized or reduced in the occurrence of the low density spots in the image formation.

There is provided by the present invention a light-sensitive material comprising a light-sensitive layer containing silver halide, a reducing agent and an ethylenic unsaturated polymerizable compound provided on a paper support, wherein the paper support comprises a coating layer containing a hydrocarbon resin provided on a base paper sheet, and the paper support has a very specifically low water absorptiveness on the surface of the coating layer on which the light-sensitive layer is provided. The water absorptiveness should be not more than 1 g/m$^2$ which is a value measured according to Cobb test method. Cobb test method is well known in paper manufacturing technology, and for instance is defined in JIS(Japanese Industrial Standard)-P-8140, which is similar to TAPPI T-441 OS-69.

The present inventors have found that the sensitivity of the light-sensitive material is reduced when certain image forming components of the light-sensitive layer penetrate into or adhere to the paper support. Especially, if a base or base precursor (one of image formation accelerators) contained in the light-sensitive layer penetrates into or adhere to the paper support, the sensitivity of the light-sensitive material is greately reduced. The coating layer containing the hydrocarbon resin prevents the components of the light-sensitive layer from not only penetrating into but also adhering to the paper support. Accordingly, in the light-sensitive material of the present invention, the components of the light-sensitive layer scarcely penetrates into or adhere to the paper support. Therefore, the light-sensitive material of the invention has a high sensitivity and gives a clear image.

Further, the present inventors have noted that the above-mentioned paper support, which comprises a coating layer containing a hydrocarbon resin provided on a base paper sheet, generally has a low water absorptiveness of not more than 1 g/m$^2$ on the surface of the coating layer. In the light-sensitive material of the present invention, the water absorptiveness of the paper support is so low that the penetration of the components as well as water into the support can be greatly reduced in the course of the preparation of the light-sensitive material. Therefore, the light-sensitive material of the invention gives an improved clear image in which the occurrence of low density spots in the image formation is greatly minimized or reduced.

DETAILED DESCRIPTION OF THE INVENTION

The light-sensitive material of the present invention utilizes a paper support. In the present invention, the paper support comprises a base paper sheet essentially composed of wood pulp (hereinafter referred to as "base paper sheet") and a coating layer containing a hydrocarbon resin.

In the present specification, the term "hydrocarbon resin" means a synthetic resin substantially composed of hydrocarbon. Preferably, carbon and hydrogen atoms are present to the extent of at least 90% of the chemical composition of the resin. The hydrocarbon resin has an average molecular weight preferably in the range of 300 to 10,000, and more preferably in the range of 1,000 to 5,000.

Various polymers can be employed as the hydrocarbon resin. In the present invention, a petroleum resin is particularly preferred, because the petroleum resin is not expensive and shows an excellent function of preventing the components of the light-sensitive layer from penetrating into or adhering to the paper support.

The petroleum resin is obtained by polymerizing unsaturated aromatic hydrocarbon or unsaturated aliphatic hydrocarbon having 5 or more carbon atoms which is a by-product of naphtha cracking. Examples of the unsaturated aromatic hydrocarbons and unsaturated aliphatic hydrocarbons include cyclopentadiene, methylstyrene, ethylstyrene, dimethylstyrene, methylindene and methylpropenylbenzene. In the present invention, it is preferred that maleic anhydride is partially introduced into the petroleum resin.

Other hydrophobic polymers can be contained in the coating layer in addition to the above-mentioned hydrocarbon resin The polymer can be a homopolymer or a copolymer. The copolymer may partially contain a hydrophilic repeating unit so long as it is hydrophobic as a whole. Examples of the hydrophobic polymers include polyvinylidene chloride, styrene-butadiene copolymer, methyl methacrylate-butadiene copolymer, acrylonitrilebutadiene copolymer, styrene-acrylate copolymer, methyl methacrylate-acrylate copolymer and styrene-methacrylate-acrylate copolymer.

The hydrophobic polymer preferably has a cross-linked structure. The cross-linked structure can be introduced into the hydrophobic polymer when a conventional hardening agent (crosslinking agent) is used together with the hydrophobic polymer in the course of the preparation of the paper support. Examples of the hardening agents include an active vinyl compound (e.g., 1,3-bis(vinylsulfonyl)-2-propanol, methylenebismaleimide), an active halogen compound (e.g., sodium salt of 2,4-dichloro-6-hydroxy-s-triazine, 2,4-dichloro-6-hydroxy-s-triazine, N,N'-bis(2-chloroethylcarbamyl)-piperazine), an epoxy compound (e.g., bis(2,3-epoxypropyl)methylpropylammonium p-toluenesulfonate), and a methanesulfonate compound (e.g., 1,2-di(methane-sulfonoxy)ethane).

A pigment can be added to the coating layer containing the hydrophobic polymer to improve the smoothness of the surface of the coating layer and to facilitate the formation of the coating layer in the course of the preparation. The pigment may be any of pigments employed in a conventional coated paper (coat paper, art paper, baryta paper etc.). Examples of the inorganic pigments include titanium dioxide, barium sulfate, talc, clay, kaolin, calcined kaolin, aluminum hydroxide, amorphous silica, crystalline silica and synthetic alumina silica. Examples of the organic pigments include polystyrene resin, acrylic resin, urea-formaldehyde resin.

A waterproofing agent can be also added to the coating layer. Examples of the waterproofing agents include polyamide-polyamine-epichlorohydrin resin, polyamidepolyurea resin, glyoxal resin. Resins containing no formaldehyde (e.g.. polyamide-polyamine-epichlorohydrin resin and polyamide-polyurea resin) are particularly preferred.

The coating layer containing the hydrocarbon resin can be prepared by coating a solution on the surface of the base paper sheet. A latex in which the components such as the hydrocarbon resin, another hydrophobic polymer, hardening agent, pigment and/or waterproofing agent are dissolved, dispersed or emulsified can be used as the coating solution. The coating solution can be coated on the base paper sheet according to any of the conventional coating methods such as dip coating method, air-knife coating method, curtain coating method, roller coating method, doctor coating method, gravure coating method, etc.

The coating layer containing the hydrocarbon resin is preferably provided on the base paper sheet in a coating amount of 2 to 20 g/m$^2$. The hydrocarbon resin is preferably contained in the coating layer in an amount of 0.5 to 5 g/m².

The paper support can be passed through a calender such as gloss calender or supercalender to improve the smoothness of the paper support simultaneously with or after coating the layer containing the hydrophobic polymer on the base paper sheet.

The paper support having a low water absorptiveness of not more than 1 g/m² (the water absorptiveness is according to Cobb test method which is defined by JIS-P-8140; hereinafter referred to as Cobb's water absorptiveness) can be prepared by providing the above-stated coating layer containing the hydrocarbon resin on a base paper sheet.

The Cobb's water absorptiveness is measured according to the following manner. Distilled water is brought into contact with the circular area (100 cm²) at the central part of a test piece (130×130 mm) for 120 seconds, and the increase in weight of the test piece is measured. The product of the increased weight (g) multiplied by 100 is defined as Cobb's water absorptiveness. Testing method and apparatus for water absorptiveness of paper (Cobb test) is described in more detail in Specification of Japanese Industrial Standard (JIS-P-8140, 1964).

The base paper sheet used for the paper support is mainly composed of wood pulp. As the wood pulp, any of softwood pulp and hardwood pulp can be used. However, hardwood pulp is more preferred, because it is mainly composed of short fibers, which are convenient for increasing the smoothness of the paper. In more detail, hardwood pulp is preferably used in an amount of not less than 60 weight % based on the total amount of pulp contained in the base paper sheet.

The wood pulp can be partially replaced with a synthetic pulp composed of polyethylene, polypropylene or the like, or a synthetic fiber composed of a polyester, polyvinyl alcohol, nylon or the like.

The Canadian standard freeness (CSF) of wood pulp as a whole preferably ranges from 200 to 400 cc, and more preferably from 250 to 350 cc. After having been beaten, the pulp preferably has such a distribution of fiber length that the amount of residual pulp on 24 mesh screen and on 42 mesh screen is not more than 40 weight % based on the total amount of pulp. The method for the determination of the fiber length distribution is defined in JIS-P-8207.

An internal size such as a rosin, a paraffin wax, a higher fatty acid, an alkenylsuccinic acid, a fatty acid anhydride and alkylketene dimer can be added to paper stuff.

A filler (e.g., calcium carbonate, talc, clay, kaolin, titanium dioxide, fine particles of urea resin), a paper strengthening agent (e.g., polyacrylamide, starch, polyvinyl alcohol), a softening agent (e.g., a reaction product of a maleic anhydride copolymer with a polyalkylene polyamine, a quarternary ammonium salt of a higher fatty acid), a fixing agent (e.g., alminium sulfate, polyamide-polyamine-epichlorohydrin), a colored dye and/or a fluorescent dye can be added to the base paper sheet.

The base paper sheet can be prepared by Fourdrinier paper machine or Cylinder paper machine. The base paper sheet preferably has a basis weight of 20 g/m² to 200 g/m², and more preferably 30 g/m² to 100 g/m². The thickness of the base paper sheet preferably ranges from 25 to 250 μm, and more preferably from 40 to 150 μm.

The base paper sheet can be passed through a calender such as on-machine calender in a paper machine or supercalender outside a paper machine to improve the smoothness. After having been calendered, the density (bulk density) of the base paper sheet preferably ranges from 0.7 to 1.2 g/m², and more preferably from 0.85 to 1.10 g/m², wherein the value is measured according to JIS-P-8118.

The base paper sheet employed for the paper support of the present invention preferably has a stiffness of 20 to 150 g to the direction of conveying, wherein the stiffness is defined by JIS-P-8143. The light-sensitive material of the invention can be used in an image recording apparatus having a conveying device for the light-sensitive material According to study of the present inventors, the base paper sheet having a stiffness of not more than 20 g to the direction of conveying is apt to be folded at its edge, and the folded base paper sheet causes jamming of the light-sensitive material in the image recording apparatus. On the other hand, the base paper sheet having a stiffness of not less than 150 g to the direction of conveying has a problem that the light-sensitive material rolled in a cassette of the apparatus can not have a constant rolled length. Further, the base paper sheet having a stiffness of not less than 150 g increases a load on the motor of a roller in a transferring device, and affects the durability of the image recording apparatus.

In the light-sensitive material of the invention, the paper support is prepared by coating the layer containing thy hydrocarbon resin on the above-mentioned base paper sheet.

A conventional surface size can be coated on the surface of the base paper sheet prior to coating the layer containing a hydrocarbon resin on the base paper sheet. Examples of the surface size include polyvinyl alcohol, starch, polyacrylamide, gelatin, casein, styrene-maleic anhydride copolymer, alkylketene dimer, polyurethane, an epoxidized fatty acid amide.

The silver halide, the reducing agent, the polymerizable compound which constitute the light-sensitive layer provided on the paper support are described below. Thus composed material is referred hereinafter to as "light-sensitive material".

There is no specific limitation with respect to silver halide contained in the light-sensitive layer. Examples of the silver halides include silver chloride, silver bromide, silver iodide, silver chlorobromide, silver chloroiodide, silver iodobromide, and silver chloroiodobromide in the form of grains.

The halogen composition of individual grains may be homogeneous or heterogeneous. A silver halide grain can have a core/shell structure in which the silver iodide content in the shell is higher than that in the core. There is no specific limitation on the crystal habit of silver halide grains. For example, a tubular grain having an aspect ratio of not less than 3 can be used.

Two or more kinds of silver halide grains which differ in halogen composition, crystal habit, grain size, and/or other features from each other can be used in combination. There is also no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 μm, more preferably 0.001 to 2 μm.

The total silver content (including silver halide and an organic silver salt which is one of optional components) in the light-sensitive layer preferably is in the range of from 0.1 mg/m² to 10 g/m². The silver content of the silver halide in the light-sensitive layer preferably is not more than 0.1 g/m², more preferably in the range of from 1 mg to 90 mg/m².

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-amino-pyrazoles, 4-amino-5-pyrazolones, 5-aminouracils, 4,5-dihydroxy-6-aminopyrimidines, reductones, aminoreductones, o- or p-sulfonamidophenols, o- or p-sulfonamido-naphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication Nos. 61(1980)-183640, 61(1986)-188535 and 61(1986)-228441. These reducing agents are also described in T. James, "The Theory of the Photographic Process⇌, 4th edition, pp. 291-334 (1977), Research Disclosure No. 17029, pp. 9-15 (June 1978), and Research Disclosure No. 17643, pp. 22-31 (December 1978). The reducing agents described in the these publications can be employed in the light-sensitive material of the present invention. Thus, "the reducing agent(s)" in the present specification means to include all of the reducing agents described in the above mentioned publications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, except that the compound has an ethylenic unsaturated group. Any known ethylenic unsaturated polymerizable compounds (including monomers, oligomers and polymers) can be contained in the light-sensitive layer. In the image-forming method of the invention, a polymerizable compounds having a relatively higher boiling point (e.g., 80° C. or higher) is preferably employed because it is hardly evaporated upon heating. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds. Further, in the case that a transferred image is formed on an image-receiving material, the polymerizable compound preferably has a viscosity of not lower than 100 cP at 25° C.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxyethyl acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. For example, a mixture of two or more polymerizable compounds can be employed. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

Various embodiments of the light-sensitive materials, optional components which may be contained in the light-sensitive layer, and auxiliary layers which may be optionally arranged on the light-sensitive materials are described below.

The polymerizable compound is preferably dispersed in the form of oil droplets in the light-sensitive layer. Other components in the light-sensitive layer, such as silver halide, the reducing agent, the color image forming substances may be also contained in the oil droplets.

In the case that silver halide grains are contained in the oil droplets, the oil droplets containing five or more silver halide grains are preferably more than 50% by weight.

The oil droplets of the polymerizable compound are preferably prepared in the form of microcapsules. There is no specific limitation on preparation of the microcapsules.

There is also no specific limitation on shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehide resin, gelatin, epoxy resin, a complex resin containing polyamide resin and polyurea resin, a complex resin containing polyurethane resin and polyester resin.

The mean size of the microcapsule preferably ranges from 0.5 to 50 $\mu$m, more preferably 1 to 25 $\mu$m, most preferably 3 to 20 $\mu$m.

In the case that silver halide is contained in the microcapsule, at least 70% of the silver halide is preferably arranged in the shell material of the microcapsules, and more preferably at least 90% of the silver halide is arranged in the shell.

Further, two or more kinds of the microcapsules differing from each other with respect to at least one of the silver halide, the polymerizable compound and the color image forming substance can be employed. Furthermore, three or more kinds of the microcapsules differing from each other with respect to the color image forming substance is preferably employed to form a full color image.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers, binders and solvent of the polymerizable compound.

There is no specific limitation with respect to the color image forming substance, and various kinds of substances can be employed. Thus, examples of the color image forming substance include both colored substance (i.e., dyes and pigments) and non-colored or almost noncolored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145 (corresponding to U.S. Pat. No. 4,629,676 and European Patent Provisional Publication No. 0174634A2).

Examples of the dyes and pigments (i.e., colored substances) employable in the invention include commercially available ones, as well as various known compounds described in the technical publications, e.g., Yuki Gosei Kagaku Kyokai (ed.). Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975). pp. 29-58 (pressure-sensitive copying paper), pp. 87-95 (azo-graphy), pp. 118-120 (heat-sensitive color formation by a chemical change) or in MSS. of the seminar promoted by the Society of Kinki Chemical Industry, "The Newest Chemistry of Coloring Matter - Attractive Application and New Development as a Functional Coloring Matter", pp. 26-32 (June 19, 1980).

In the case that the color image forming substance comprising two components (e.g., a color former and a developer), one component and the polymerizable compound is contained in the microcapsule, and the other component is arranged outside of the microcapsule in the light-sensitive layer, a color image can be formed on the light-sensitive layer.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inoganic silver salt can be added to the light-sensitive layer to obtain the same effect.

Various image formation accelerators are employable in the light-sensitive material The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors (these three accelerators have been previously described), oils, surface active agents, compounds functioning as an antifogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

In the light-sensitive material, the silver halide, the reducing agent and the polymerizable compound are preferably contained in a microcapsule and the base or base precursor is preferably arranged outside of the microcapsule in the light-sensitive layer. Further, the base or base precursor can be contained in a different microcapsule from that containing the polymerizable compound. The base or base precursor can be contained in the microcapsule under condition that the base or base precursor is dissolved or dispersed in an aqueous solution of a water retention agent, or under condition that the base or base precursor is adsorbed on solid particles. Furthermore, the base or base precursor can be contained in a layer different from the light-sensitive layer.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (e.g., a cyclic amide compound), a thiourea derivative, a thioether compound, a polyethylene glycol derivative, a thiol derivative, an acetylene compound and a sulfonamide derivative.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure 26–28 (Dec. 1976). The hot-melt solvent is preferably used in an amount of from 0.5 to 50% by weight, and more preferably from 1 to 20% by weight, based on the total solid content of the light-sensitive layer.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development.

The antismudging agents employable in the light-sensitive material preferably are particles which are solid at ambient temperatures. Such particles preferably have a mean size of 3 to 50 μm, more preferably 5 to 40 μm. When the microcapsule is employed in the light-sensitive material, the size of said particle is preferably larger than that of the microcapsule.

Binders employable in the light-sensitive material preferably are transparent or semi-transparent hydrophilic binders. The light-sensitive material employing a binder is described in Japanese Patent Provisional Publication No. 61(1986)-69062 (corresponding to U.S. Pat. No. 4,629,676 and European Patent Provisional Publication No. 0174634A2).

In the case that the solvent of the polymerizable compound is used, the solvent is preferably contained in a microcapsule which is different from the microcapsule containing the polymerizable compound.

Examples and usage of the other optional components which can be contained in the light-sensitive layer are also described in the above-mentioned publications and applications concerning the light-sensitive material, and in Research Disclosure Vol. 170, No. 17029, 9–15 (June 1978). The light-sensitive layer preferably has a pH value of not higher than 7.

Examples of auxiliary layers which are optionally arranged on the light-sensitive material include an image-receiving layer, a heating layer, an antistatic layer, an anticurl layer, a release layer, a cover sheet or a protective layer, a layer containing a base or base precursor and a base barrier layer.

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving material.

The light-sensitive material can be prepared, for instance, by the following process.

The light-sensitive material is usually prepared by dissolving, emulsifying or dispersing each of the components of the light-sensitive layer in an adequate medium to obtain a coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be used.

In the preparation of the silver halide emulsions, hydrophilic colloids (e.g., gelatin) are advantageously used as protective colloids to improve the sensitivity of the light-sensitive material. In the formation of silver halide grains in the silver halide emulsion, ammonia, an organic thioether derivative or sulfur-containing compound can be used as a silver halide solvent. Further, in the grain formation or physical ripening, a cadmium salt, a zinc salt, a lead salt, a thallium salt, or the like can be introduced into the reaction system. Furthermore, for the purpose of overcoming high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

Where the sensitizing dyes are added to the silver halide emulsion, the sensitizing dye is preferably added during the preparation of the emulsion where the 5- or 6- membered nitrogen containing heterocyclic compounds are added to the silver halide emulsion as an antifogging agent and/or a development accelerator, the compounds are preferably added during the grain formation or the ripening of the emulsion.

Where the organic silver salts are introduced in the light-sensitive microcapsule, the emulsion of the organic silver salts can be prepared in the same manner as in the preparation of the silver halide emulsion.

In preparation of the light-sensitive material, the polymerizable compounds are used as the medium for preparation of the liquid composition containing another component of the light-sensitive layer. For example, the silver halide, including the silver halide emulsion), the reducing agent, or the color image forming substance can be dissolved, emulsified or dispersed in the polymerizable compound to prepare the light-sensitive material. Especially, the color image forming substance is preferably incorporated in the polymerizable compound. Further, the necessary components for preparation of a microcapsule such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispersed state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

The polymerizable compound (including the light-sensitive composition) are preferably emulsified in an aqueous medium to prepare the coating solution. The necessary components for preparation of the microcapsule, such as shell material can be incorporated into the emulsion. Further, other components such as the reducing agent can be added to the emulsion.

The emulsion of the polymerizable compound can be processed for forming shell of the microcapsule. It is preferable, though not limitative, that the microcapsule is prepared by emulsifying core materials containing the polymerizable compound and forming a polymeric membrane (i.e., shell) over the core materials.

When the emulsion of the polymerizable compound (including the dispersion of the microcapsule) has been prepared by using the light-sensitive composition, the emulsion can be used as the coating solution of the light-sensitive material. The coating solution can be also prepared by mixing the emulsion of the polymerizable compound and the silver halide emulsion. The other components can be added to the coating solution in a similar manner as the emulsion of the polymerizable compound.

The light-sensitive material of the invention can be prepared by coating and drying the coating solution on a support in the conventional manner.

Use of the light-sensitive material is described below.

In the use of the light-sensitive material of the invention, a development process is conducted simultaneously with or after an imagewise exposure.

Various exposure means can be employed in the imagewise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149 (corresponding to U.S. Pat. No. 3,697,275). The image forming method described in Japanese Patent Provisional Publication No. 61(1986)-69062 (corresponding to U.S. Pat. No. 4,629,676 and European Patent Provisional Publication No. 0174634A2) which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means in the same manner as the light-sensitive material described in Japanese Patent Provisional Publication No. 61(1986)-294434. Further, the light-sensitive material can be heated while suppressing supply of oxygen into the light-sensitive layer from outside. The heating temperature for the development process usually ranges from 80° C. to 200° C., and preferably from 100° C. to 160° C. Various heating patterns are applicable. The heating time is usually not shorter than 1 second, and preferably from 1 second to 5 minutes, and more preferably from 1 second to 1 minute.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

In the above development process, a polymer image can be formed on the light-sensitive layer. A pigment image can be also obtained by fixing pigments to the polymer image.

Further, a color image can be formed on the light-sensitive material in which the light-sensitive layer contains a color former and a developer, one of them is together with the polymerizable compound contained in a microcapsule, and the other is arranged outside of the microcapsule.

The image can be also formed on the image-receiving material. The image-receiving material is described hereinbelow. The image forming method employing the image-receiving material or the image-receiving layer is described in Japanese Patent Provisional Publication No. 61(1980)-278849.

Examples of the material employable as the support of the image-receiving material include glass, paper, fine paper, coat paper, cast-coated paper, baryta paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support of the image-receiving material, the porous support preferably has such a surface characteristic that a filtered maximum waviness of not less than 4 μm is observed in not more than 20 positions among 100 positions which are determined at random on a filtered waviness curve obtained according to JIS-B-0610. Further, a transparent material can be used as the support of the image-receiving material to obtain a transparent or a projected image.

The image-receiving material is usually prepared by providing the image-receiving layer on the support. The image-receiving layer can be constructed according to the color formation system. In the cases that a polymer image is formed on the image-receiving material and that a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-receiving layer is also employable in the image-receiving layer. Further, a polymer having a transmission coefficient of oxygen of not more than $1.0 \times 10^{-11}$ cm$^3$·cm/cm$^2$·sec·cmHg can be used as the binder to protect the color of the image formed on the image-receiving material.

The image-receiving layer can contain a granulated thermoplastic compound to obtain a glossy image. Further, the image-receiving layer can contain a white pigment (e.g., titanium dioxide) to function as a white reflection layer. Furthermore, a photo polymerization initiator or a thermalpolymerization initiator can be contained in the image-receiving layer to polymerize the unpolymerized polymerizable compound.

The image-receiving layer can be composed of two or more layers according to the above-mentioned functions. The thickness of the image-receiving layer preferably ranges from 1 to 100 μm, more preferably from 1 to 20 μm.

A protective layer can be provided on the surface of the image-receiving layer.

After the development process, pressing the light-sensitive material on the the image-receiving material to transfer the unpolymerized polymerizable compound to the image-receiving material, a polymer image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material on the image-receiving material to transfer the color image forming substance in unfixed portion, a color image can be produced on the image-receiving material.

After the image is formed on the image-receiving material, the image-receiving material can be heated to polymerize the transferred unpolymerized polymerizable compound. By the above-mentioned porcess, the obtained image can be improved in the preservability.

Various image recording apparatus can be used for the image-forming method. An example of the apparatus comprises an exposure device for imagewise exposing a light-sensitive material to form a latent image, a heat development device for fixing the area corresponding to te latent image, a transfer device for pressing the developed light-sensitive material on an image-receiving material. Another example of the apparatus comprises an fixing device for irradiating, pressing or heating the image-receiving material on which an image has been transferred in addition to the above-mentioned devices.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of Paper Support

In a disk refiner, 25 weight parts of a laubholz bleached sulfite pulp (LBSP) and 75 weight parts of a laubholz bleached kraft pulp (LBKP) were beaten to obtain a pulp having Canadian standard freeness of 270 cc. To the obtained pulp were added 0.2 weight part of alkylketene dimer, 0.3 weight part of polyamide-polyamineepichlorohydrin, 0.1 weight part of epoxidation fatty acid amide and 0.5 weight part of cationic polyacrylamide to obtain a paper stuff, in which the part was a dry weight ratio to one part of the pulp. A base sheet sheet having basis weight of 70 g/m$^2$ and thickness of 72 μm was prepared from the obtained paper stuff using a Fourdrinier paper machine.

The stiffness of the base paper sheet to the direction of conveying was measured according to the testing method defined in JIS-P-8143. The stiffness of the base paper sheet was 28 g.

On the surface (felt side) of the base paper sheet was coated a mixture of 100 weight parts of petroleum resin (Carbomule R produced by DIC-HERCULES CO., LTD.), 100 weight parts of clay (UW-90 produced by Engelhard Co., Ltd.), 50 weight parts of calcium carbonate (Tankaru PC produced by Shiroishi Kogyo Co., Ltd.) and 100 weight parts of latex of SBR (styrene-butadiene rubber, SN-304 produced by Sumitomo Naugatac Co., Ltd.) in a coating amount of 5 g/m$^2$ using air-knife coating method. Thus, a paper support (a) was obtained.

The Cobb's water absorptiveness on the surface of the coating layer of the paper support (a) was 0.3 g/m$^2$.

Preparation of Silver Halide Emulsion

In 1,000 ml of water were dissolved 20 g of gelatin and 3 g of sodium chloride, and the resulting gelatin solution was kept at 75° C. To the gelatin solution, 600 ml of an aqueous solution containing 21 g of sodium chloride and 56 g of potassium bromide and 600 ml of an aqueous solution containing 0.59 mole of silver nitrate were added simultaneously at the same feed rate over a period of 40 minutes to obtain a silver chlorobromide emulsion having cubic grains, uniform grain size distribution, a mean grain size of 0.35 μm and a bromide content of 80 mole %.

The emulsion was washed for desalting and then subjected to chemical sensitization with 5 mg of sodium thiosulfate and 20 mg of 4-hydroxy-6-methyl-1,3,3a, 7-tetrazaindene at 60° C. Yield of the emulsion was 600 g.

Preparation of Silver Benzotriazole Emulsion

In 3,000 ml of water were dissolved 28 g of gelatin and 13.2 g of benzotriazole, and the solution was kept at 40° C. while stirring. To the solution was added 100 ml of an aqueous solution of 17 g of silver nitrate over 2 min. Excessive salts were sedimented and removed from the resulting emulsion by pH-adjustment. Thereafter, the emulsion was adjusted to pH 6.30 to obtain a silver benzotriazole emulsion. The yield of the emulsion was 400 g.

Preparation of Light-Sensitive Composition

In 100 g of trimethylolpropane triacrylate were dissolved 0.40 g of the following copolymer, 6.00 g of Pargascript Red I-6-B (tradename of Ciba-Geigy) and 2 g of Emulex NP-8 (tradename of Nippon Emulsion Co., Ltd.).

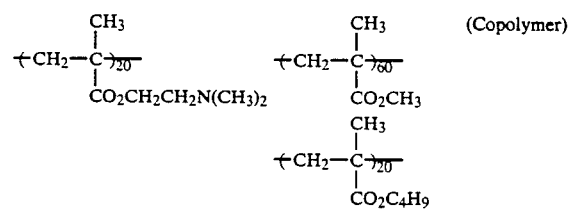

In 18.00 g of the solution was dissolved 0.002 g of the following thiol derivative.

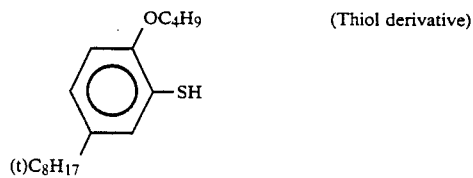

To the resulting solution was added a solution in which 0.16 g of the following reducing agent (I) and 1.22 g of the following reducing agent (II) are dissolved in 1.80 g of methylene chloride.

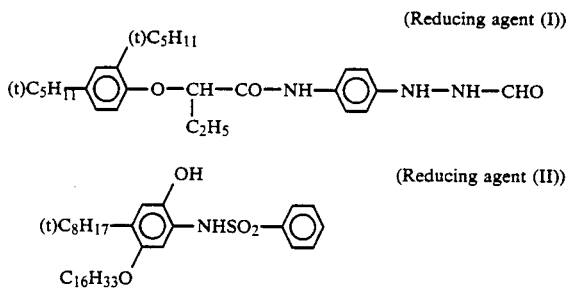

To the resulting solution were added 3.50 g of the silver halide emulsion and 3.35 g of the silver benzotriazole emulsion, and the mixture was stirred at 15,000 r.p.m. for 5 minutes to obtain a light-sensitive composition.

Preparation of Light-Sensitive Microcapsule

To 10.51 g of 18.6% aqueous solution of Isobam (tradename of Kuraray Co., Ltd.) was added 48.56 g of 2.89% aqueous solution of pectin. After the solution was adjusted to a pH of 4.0 using 10% sulfuric acid, the light-sensitive composition was added to the resulting solution, and the mixture was stirred at 7,000 r.p.m. for 2 minutes to emulsify the light-sensitive composition in the aqueous medium.

To 72.5 g of the aqueous emulsion were added 8.32 g of 40% aqueous solution of urea, 2.82 g of 11.3% aqueous solution of resorcinol, 8.56 g of 37% aqueous solution of formaldehyde and 3.00 g of 8.00% aqueous solution of ammonium sulfate in order, and the mixture was heated at 60° C. for 2 hours while stirring. After the mixture was adjusted to a pH of 7.3 using 10% aqueous solution of sodium hydroxide, 3.62 g of 30.9% aqueous solution of sodium hydrogen sulfite was added to the mixture to obtain a dispersion containing light-sensitive microcapsules.

Preparation of Light-Sensitive Material

To 10.0 g of the light-sensitive microcapsule dispersion were added 1.0 g of 1% aqueous solution of the following anionic surfactant and 5 g of 10% aqueous solution (solvent: water/ethanol=50/50 as volume ratio) of guanidine trichloroacetate to prepare a coating solution.

The coating solution was uniformly coated on the coating layer of the paper support (a) using a coating rod of #40 in an coating amount of 70 cc/m² and dried at 40° C. to obtain a light-sensitive material (A).

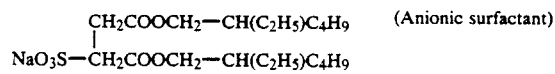

EXAMPLE 2

Preparation of Paper Support

On the surface (felt side) of the base paper sheet prepared in Example 1 was coated a mixture of 100 weight parts of petroleum resin (Carbomule R produced by DIC-HERCULES CO., LTD.), 150 weight parts of clay (K Clay produced by Katsukozan Kogyo, Co., Ltd.) and 100 weight parts of MBR latex (Lacstar M-964 produced by Dainippon Ink & Chemical Inc.) in a coating amount of 6 g/m² using air-knife coating method. Thus, a paper support (b) was obtained.

The Cobb's water absorptiveness of the coating layer of the paper support (b) was 0.5 g/m².

Preparation of Light-Sensitive Material

A light-sensitive material (B) was prepared in the same manner as in Example 1, except that the paper support (b) was used.

EXAMPLE 3

Preparation of Paper Support

On the surface (felt side) of the base paper sheet prepared in Example 1 was coated a mixture of 100 weight parts of petroleum resin (Resin WR produced by DIC-HERCULES CO., LTD.), 130 weight parts of kaolin (Satinton No. 1 produced by Engelhard, Co., Ltd.), 70 weight parts of talc (LMR-100 produced by Fuji Talc Co., Ltd.) and 50 weight parts of acryl emulsion (Bonron S-1143 produced by Mitsui Toatsu Chemicals, Inc.) in a coating amount of 5 g/m² using air-knife coating method. Thus, a paper support (c) was obtained.

The Cobb's water absorptiveness on the surface of the coating layer of the paper support (c) was 0.2 g/m².

Preparation of the Light-Sensitive Material

A light-sensitive material (C) was prepared in the same manner as Example 1, except that the paper support (c) was used.

COMPARISON EXAMPLE 1

Preparation of Paper Support

The base paper sheet prepared in Example 1 was itself used as a paper support (d).

The Cobb's water absorptiveness on the surface (felt side) of the coating layer of the paper support (d) was 21.3 g/m².

Preparation of Light-Sensitive Material

A light-sensitive material (D) was prepared in the same manner as in Example 1, except that the paper support (d) was used.

COMPARISON EXAMPLE 2

Preparation of Paper Support

On the surface (felt side) of the base paper sheet prepared in Example 1 was coated a mixture of 100 weight parts of kaolin (Ansilex-90 produced by Engelhard Co., Ltd.), 30 weight parts of starch (MS #4600 produced by Japan Maize Products Co., Ltd.) and 20 weight parts of polyamide.polyurea (SR-636 produced by Sumitomo Chemical Co., Ltd) in a coating amount of 60 g/m² using air-knife coating method. Thus, a paper support (e) was obtained.

The Cobb's water absorptiveness on the surface of the coating layer of the paper support (e) was 15.1 g/m².

Preparation of the Light-Sensitive Material

A light-sensitive material (E) was prepared in the same manner as in Example 1, except that the paper support (e) was used.

COMPARISON EXAMPLE 3

Preparation of Paper Support

On the surface (felt side) of the base paper sheet prepared in Example 1 was coated a mixture of 100 weight parts of clay (UW-90 produced by Engelhart Co., Ltd.), 50 weight parts of SBR latex (SN-304 produced by Sumitomo Naugatac Co., Ltd.) and 50 weight parts of alkyd resin (Size Up 411k produced by Arakawa Kagaku Co., Ltd.) in a coating amount of 6 g/m² using air-knife coating method. Thus, a paper support (f) was obtained.

The Cobb's water absorptiveness on the surface of the coating layer of the paper support (f) was 8.2 g/m².

Preparation of the Light-Sensitive Material

A light-sensitive material (F) was prepared in the same manner as in Example 1, except that the paper support (f) was used.

COMPARISON EXAMPLE 4

Preparation of Paper Support

On the surface (felt side) of the base paper sheet prepared in Example 1 was coated a mixture of 100 weight parts of calcium carbonate (Tankaru PC produced by Shiroisi Kogyo Co, Ltd.), 100 weight parts of MBR latex (Lacster M-964 produced by Dainippon Ink, Co. ltd.) and 20 weight parts of melamine-formaldehyde resin (SR-613 produced by Sumitomo Chemical Co., Ltd) in a coating amount of 6 g/m² using air-knife coating method. Thus, a paper support (g) was obtained.

The Cobb's water absorptiveness on the surface of the coating layer of the paper support (g) was 6.3 g/m².

Preparation of the Light-Sensitive Material

A light-sensitive material (G) was prepared in the same manner as in Example 1, except that the paper support (g) was used.

Preparation of Image-Receiving Material

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer. The coarse dispersion was then finely dispersed in Dynomill dispersing device. To 200 g of the resulting dispersion were added 6 g of 50% latex of SBR (styrene-butadiene rubber) and 55 g of 8% aqueous solution of polyvinyl alcohol, and the resulting mixture was made uniform.

The mixture was then uniformly coated on a cast-coated paper to give a layer having a wet thickness of 30 μm and dried to obtain an image-receiving material.

Evaluation of Light-Sensitive Material

Each of the light-sensitive materials prepared in Examples 1 to 3 and Comparison Examples 1 to 4 was exposed to light using a tungsten lamp at 5,000 lux for 1 second through a filter in which the density is continuously changed, and then heated at 140° C. using a heat roller type development machine for various heating time. Each of the exposed and heated light-sensitive materials was then combined with the image-receiving material and passed through press rolls under pressure of 700 kg/cm². The density on the surface of the image-receiving material was measured using Macbeth's reflection densitometer. The maximum density of each of the images was 1.2.

The results are set forth in Table 1. In Table 1, "Hydrocarbon Resin" indicates whether a hydrocarbon resin is contained in the coating layer of the paper support (+) or not (−), and "Development Time" means the heating time required to obtain an image having a minimum reflection density (Dmin) of not more than 0.1.

TABLE 1

| Light-sensitive Material | Paper Support | Hydrocarbon Resin | Water Absorptiveness | Development Time |
|---|---|---|---|---|
| (A) | (a) | (+) | 0.3 g/m² | 10 seconds |
| (B) | (b) | (+) | 0.5 g/m² | 10 seconds |
| (C) | (c) | (+) | 0.2 g/m² | 10 seconds |
| (D) | (d) | (−) | 21.3 g/m² | ≧60 seconds |
| (E) | (e) | (−) | 15.1 g/m² | ≧60 seconds |
| (F) | (f) | (−) | 8.2 g/m² | 40 seconds |
| (G) | (g) | (−) | 6.3 g/m² | 30 seconds |

It is apparent from the results in Table 1 that each of the light-sensitive materials (A), (B) and (C) has a high sensitivity and gives a clear image in a short development time. Further, it was noted that each of the light-sensitive materials of the invention gives an image wherein no low-density spot is visually observed.

We claim:

1. A light-sensitive material comprising a light-sensitive layer containing silver halide, a reducing agent and an ethylenic unsaturated polymerizable compound provided on a paper support, wherein the paper support comprises a coating layer containing a petroleum resin into which maleic anhydride is partially introduced provided on a base paper sheet, and the paper support has a low water absorptiveness of not more than 1 $g/m^2$ on the surface of the coating layer on which the light-sensitive layer is provided, said water absorptiveness being a value measured according to the Cobb test method.

2. The light-sensitive material as claimed in claim 1, wherein the petroleum resin is a synthetic resin having an average molecular weight in the range of 300 to 10,000.

3. The light-sensitive material as claimed in claim 1, wherein the coating layer contains a pigment.

4. The light-sensitive material as claimed in claim 1, wherein the coating layer is provided on the base paper sheet in an coating amount of 2 to 20 $g/m^2$.

5. The light-sensitive material as claimed in claim 1, wherein the petroleum resin is contained in the coating layer in a amount of 0.5 to 5 $g/m^2$.

6. The light-sensitive material as claimed in claim 1, wherein the light-sensitive layer contains a color image forming substance.

7. The light-sensitive material as claimed in claim 1, wherein the light-sensitive layer contains a base or a base precursor.

8. The light-sensitive material as claimed in claim 1, wherein the silver halide and polymerizable compound are contained in microcapsules which are dispersed in the light-sensitive layer.

9. A light-sensitive material comprising a light-sensitive layer containing a silver halide, a reducing agent and an ethylenic unsaturated polymerizable compound provided on a paper support, wherein the paper support comprises a coating layer containing a hydrocarbon resin and a hydrophobic polymer other than the hydrocarbon resin provided on a base paper sheet, said hydrophobic polymer having a cross-linked structure which is formed by a reaction of the hydrophobic polymer with a hardening agent, and the paper support has a low water absorptiveness of not more than 1 $g/m^2$ on the surface of the coating layer on which the light-sensitive layer is provided, said water absorptiveness being a value measured according to the Cobb test method.

10. The light-sensitive material as claimed in claim 9, wherein the hydrocarbon resin is a petroleum resin.

11. The light-sensitive material as claimed in claim 9, wherein the hydrocarbon resin is a synthetic resin having an average molecular weight in the range of 300 to 10,000.

12. The light-sensitive material as claimed in claim 9, wherein the coating layer contains a pigment.

13. The light-sensitive material as claimed in claim 9, wherein the coating layer is provided on the base paper sheet in a coating amount of 2 to 20 $g/m^2$.

14. The light-sensitive material as claimed in claim 9, wherein the hydrocarbon resin is contained in the coating layer in an amount of 0.5 to 5 $g/m^2$.

15. The light-sensitive material as claimed in claim 9, wherein the light-sensitive layer contains a color image forming substance.

16. The light-sensitive material as claimed in claim 9, wherein the light-sensitive layer conatins a base or a base precursor.

17. The light-sensitive material as claimed in claim 9, wherein the silver halide and polymerizable compound are contained in microcapsules which are dispersed in the light-sensitive layer.

* * * * *